United States Patent
Sherman et al.

(10) Patent No.: US 7,878,834 B2
(45) Date of Patent: Feb. 1, 2011

(54) CONNECTOR FOR MATING A CONTACT PIN WITH A DEVICE

(75) Inventors: Neil S. Sherman, San Bruno, CA (US); Brian H. Steuer, Menlo Park, CA (US)

(73) Assignee: Neil Sherman, San Bruno, CA (US)

( * ) Notice: Subject to any disclaimer, the term of this patent is extended or adjusted under 35 U.S.C. 154(b) by 0 days.

(21) Appl. No.: 12/424,341

(22) Filed: Apr. 15, 2009

(65) Prior Publication Data

US 2009/0264004 A1    Oct. 22, 2009

Related U.S. Application Data

(60) Provisional application No. 61/124,459, filed on Apr. 17, 2008.

(51) Int. Cl.
*H01R 13/62* (2006.01)
(52) U.S. Cl. .................... 439/324; 439/567; 439/700
(58) Field of Classification Search ................ 439/324, 439/79–82, 567, 700; 324/761
See application file for complete search history.

(56) References Cited

U.S. PATENT DOCUMENTS

| | | | |
|---|---|---|---|
| 5,297,948 A | 3/1994 | Sadr | |
| 5,452,184 A | 9/1995 | Scholder et al. | |
| 6,822,466 B1 * | 11/2004 | Holcombe et al. | .......... 324/761 |
| 7,046,020 B2 | 5/2006 | LaMeres et al. | |

* cited by examiner

*Primary Examiner*—Javaid Nasri
(74) *Attorney, Agent, or Firm*—Neustel Law Offices

(57) ABSTRACT

A connector device for maintaining a desired spatial relationship for spatially and securely connecting to a platform, such as a circuit board, in an efficient manner. The connector device generally includes a body portion separated from the secondary device, a plurality of legs extending from the body portion for removably attaching the body portion to the secondary device, wherein the plurality of legs each include a foot member insertable within an opening of the secondary device for grasping the secondary device and at least one contact pin extending from the body portion to contact the secondary device on an opposite surface as the foot member. The contact pin maintains the separation between the body portion and the secondary device and includes a spring for providing a counter force against the secondary device with respect to the foot member.

20 Claims, 17 Drawing Sheets

CONNECTOR FOR MATING A CONTACT PIN WITH A DEVICE

CROSS REFERENCE TO RELATED APPLICATIONS

I hereby claim benefit under Title 35, United States Code, Section 119(e) of U.S. provisional patent application Ser. No. 61/124,459 filed Apr. 17, 2008. The 61/124,459 application is currently pending. The 61/124,459 application is hereby incorporated by reference into this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to connectors and more specifically it relates to a device for maintaining a connector desired spatial relationship for spatially and securely connecting to a platform, such as a circuit board, in an efficient manner and for connecting a contact pin or element to a secondary device without the use of a mating connector.

2. Description of the Related Art

Any discussion of the related art throughout the specification should in no way be considered as an admission that such related art is widely known or forms part of common general knowledge in the field.

Connectors, such as electrical connectors have been in use for years and are manufactured in various different configurations. Many types of electrical connectors are designed to be soldered to a printed circuit board. Because of the small size of the connectors, soldering can often be a difficult and time consuming process. In addition, on crowded circuit boards, the ability to accurately position and hold the connector while soldering can be increasingly difficult. Another problem with soldering connectors is that the connector is secured in a relatively permanent manner and thus does not allow for easy removal of the connector.

Other types of electrical connectors are also utilized that may allow for a connection in a manner other than through soldering. However, many of these connectors are often times expensive or substantially fragile thus providing yet another inefficient manner in which to connect an electrical connector or component to a circuit board. Because of the inherent problems with the related art, there is a need for a new and improved device for maintaining a desired spatial relationship with respect to a platform, such as a circuit board, in an efficient manner.

BRIEF SUMMARY OF THE INVENTION

A system for spatially and securely connecting to a platform, such as a circuit board, in an efficient manner. The invention generally relates to a connector which includes a body portion separated from the secondary device, a plurality of legs extending from the body portion for removably attaching the body portion to the secondary device, wherein the plurality of legs each include a foot member insertable within an opening of the secondary device for grasping the secondary device and at least one contact pin extending from the body portion to contact the secondary device on an opposite surface as the foot member. The contact pin maintains the separation between the body portion and the secondary device and includes a spring for providing a counter force against the secondary device with respect to the foot member.

There has thus been outlined, rather broadly, some of the features of the invention in order that the detailed description thereof may be better understood, and in order that the present contribution to the art may be better appreciated. There are additional features of the invention that will be described hereinafter and that will form the subject matter of the claims appended hereto. In this respect, before explaining at least one embodiment of the invention in detail, it is to be understood that the invention is not limited in its application to the details of construction or to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Figure 1:
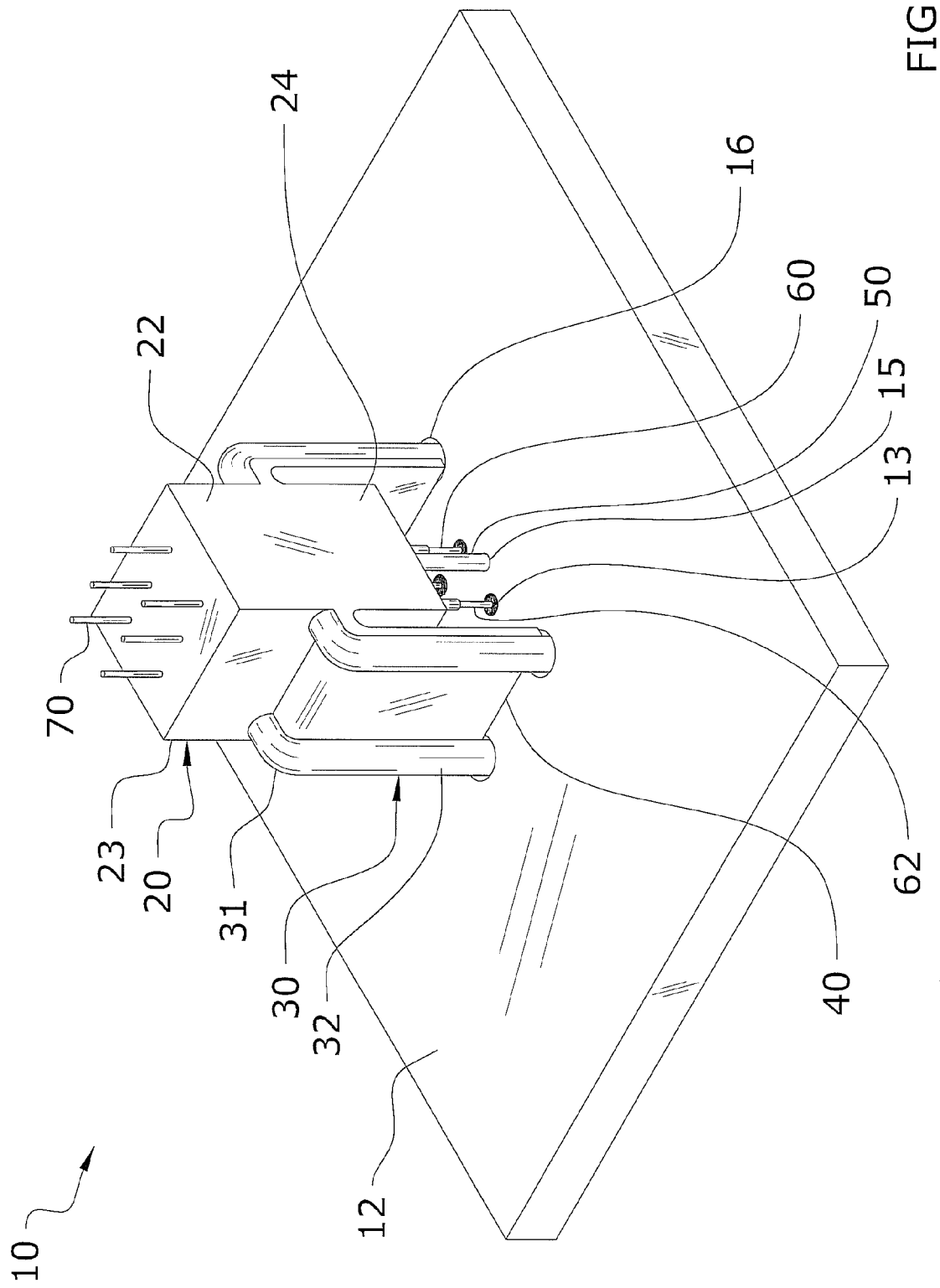
FIG. 1 is an upper perspective view of the present invention.

Turning now descriptively to the drawings, in which similar reference characters denote similar elements throughout the several views, FIGS. 1 through 17 illustrate a connector for mating a contact pin with a device 10, which comprises a body portion 22 separated from the secondary device 12, a plurality of legs 30 extending from the body portion 22 for removably attaching the body portion 22 to the secondary device 12, wherein the plurality of legs 30 each include a foot member 34 insertable within a hole 16 of the secondary device 12 for grasping the secondary device 12 and at least one contact pin 60 extending from the body portion 22 to contact the secondary device 12 on an opposite surface as the foot member 34. The contact pin 60 maintains the separation between the body portion 22 and the secondary device 12 and includes a spring 66 for providing a counter force against the secondary device 12 with respect to the foot member 34.

B. Secondary Device

The secondary device 12 in the preferred embodiment is generally comprised of a printed circuit board including a plurality of holes 15, 16 and electrical contact points 13 to receive the primary device 20 as well as other electrical components. In the preferred embodiment, the primary device 20 may be used to make a temporary or permanent connection to the circuit board 12 in order to program, configure, monitor, inspect or set some state(s) of one or more electronic devices or to form a debugging, programming, testing or state configuring connection between one or more devices and an in circuit debugger or debugger/programmer.

It is appreciated that in the preferred embodiment the secondary device 12 includes at least as many contact points 13 as contact pins 60 of the primary device 20 in which the contact points 13 are aligned with the contact pins 60 to be engaged by the contact pins 60 when the primary device 20 is secured to the secondary device 12. The contact points 13 may be comprised of electrically conductive pads, recessed portions with conductive material within, or various other configurations.

Figure 2:
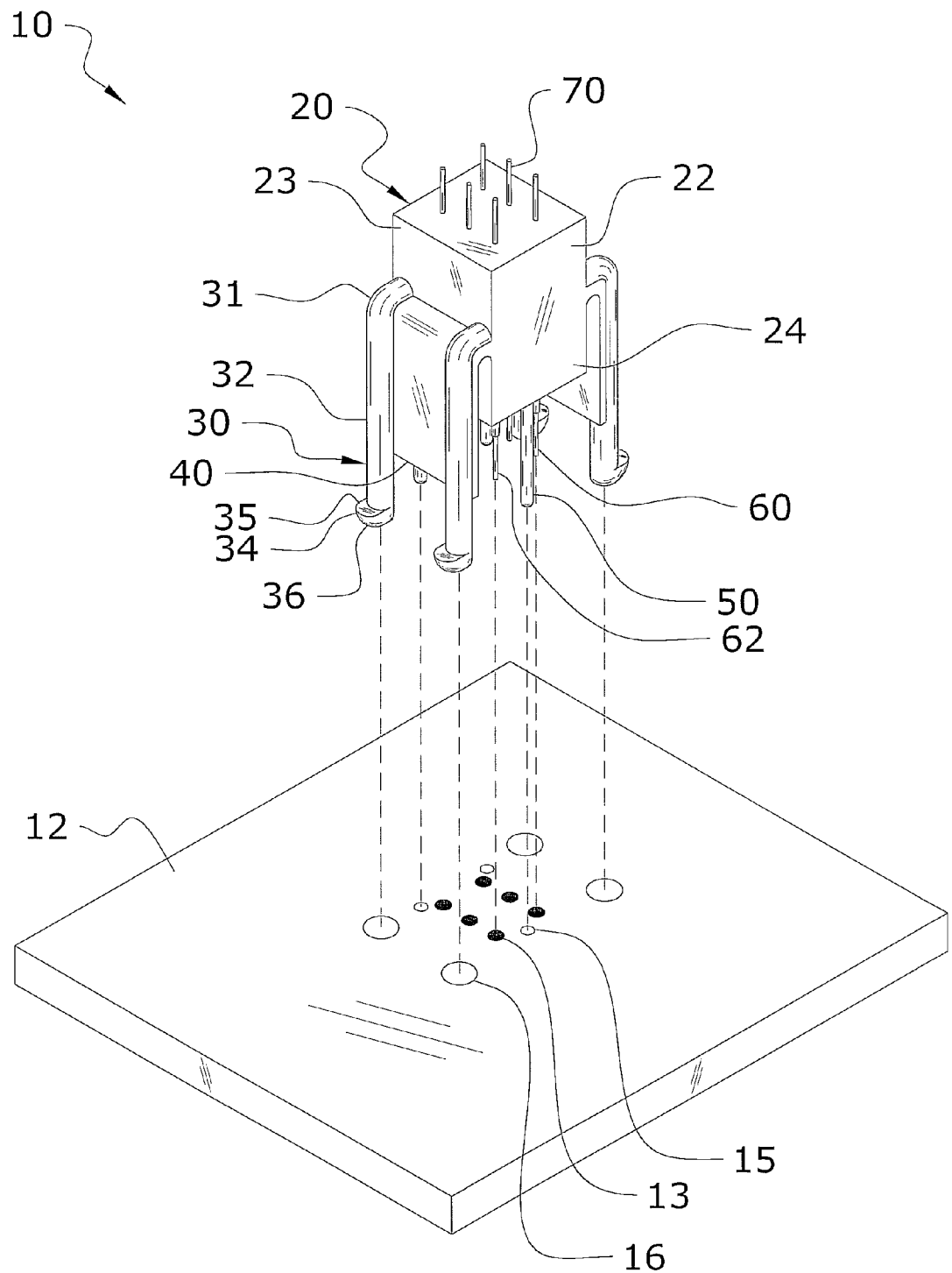
FIG. 2 is an exploded upper perspective view of the present invention.

The secondary device 12 also includes a plurality of alignment holes 15 generally positioned close to and near a perimeter around the contact points 13. The alignment holes 15 receive the alignment pins 50 of the primary device 20 to further secure the primary device 20 in a desired position about the secondary device 12 and to prevent the primary device 20 from being rotated or moved unwillingly while the alignment pins 50 are positioned within the alignment holes 15. The alignment holes 15 are also generally close fitting with respect to the alignment pins 50. In the preferred embodiment, the secondary device 12 includes an arrangement of three alignment holes 15 as illustrated in FIG. 2; however, it is appreciated that other arrangements and numbers of alignment holes 15 per set of contact points 13 may be appreciated.

The secondary device 12 also includes a plurality of securing holes 16 generally positioned close to and near a perimeter around the contact points 13 and alignment holes 15. The securing holes 16 receive the legs 30 of the primary device 20 to further secure the primary device 20 in a desired position about the secondary device 12 and to prevent the primary device 20 from being rotated or moved (vertically or horizontally) unwillingly while the legs 30 are positioned within the securing holes 16. In the preferred embodiment, the secondary device 12 includes an arrangement of four securing holes 16 as illustrated in FIG. 2; however, it is appreciated that other arrangements and numbers of securing holes 16 per set of contact points 13 may be appreciated.

Other secondary devices 12 may be used to spatially position one or more primary devices 20 other than electrical circuit boards, such as flex circuits, chip on glass, hybrid and ceramic boards, optical circuits, and other devices. It is appreciated that the term secondary device 12 may be used to refer to any such device, platform, object, board, or thing that is used to receive the primary device 20. The other secondary devices 12 may not be electrical or optical in nature. The secondary devices 12 used rather than a circuit board may be structural (e.g. part of a building, furniture, machinery, tool, or equipment) textile, paper or plastic, or otherwise primarily mechanical or aesthetic in nature. Secondary devices 12 may be raw or partially processed components of an assembly or fabrication process.

Likewise, the securing holes 16 may be omitted from the secondary device 12 in various embodiments, wherein the legs 30 are also omitted and other attachment structures, such as magnets, suction cups, adhesives, clips, static electricity, springs, compressible materials, or other mechanisms either separately or in combination may be used to spatially position one or more primary devices 20 with respect to one or more secondary devices 12 as described previously.

C. Primary Device

The primary device 20 (i.e. connector) is designed to connect to the secondary device 12 to maintain a desired spatial relationship between the primary device 20 and the secondary device 12, to easily secure the primary device 20 to the secondary device 12, to allow for easy removal of the primary device 20 from the secondary device 12 and to provide a secure and stable connection between the primary device 20 and the secondary device 12. The spatial relationship formed between the primary device 20 and the secondary device 12 is further a separation of the lower surface of the body portion 22 of the primary device 20 from the secondary device 12 and further preferably a distal separation between thereof. The primary device 20 may be used in a variety of applications, such as those relating or not relating to electrical components.

The primary device 20 may be used to temporarily or permanently spatially position electrically conductive, mechanical or other pins, electrical or optical circuits, magnets, LED's, lasers, other light sources, light pipes, or other components or devices with respect to one or more other secondary devices 12. The primary device 20 is positioned with respect to the secondary device 12 without the use of any mating connector or other components on the secondary device 12.

The body portion 22 of the primary device 20 is generally coated in a conductive material to provide EMI (electromagnetic interference) shielding; however it need not be comprised of a conductive material. The body portion 22 is also preferably comprised of a solid configuration; however, other configurations may be appreciated. The body portion 22 is also comprised of a relatively square or rectangular shape as illustrated; however, again, other shapes and configurations may be appreciated. The primary device 20 may also be asymmetrically formed, including the legs 30, the alignment pins 50, the contact pins 60, or any combination thereof.

The body portion 22 includes at least one and preferably a plurality of legs 30 extending from the sides of the body portion 22 to connect to the bottom of the secondary device 12. The legs 30 are preferably integrally formed with the body portion 22; however, separate structures may be appreciated. The legs 30 may be comprised of generally cylindrical shapes with collapsible cores or solid cores.

The legs 30 generally include a shoulder 31 extending outwardly from approximately mid height along the sides of the body portion 22. Extending vertically downward from the shoulder 31 is an elongated portion 32. The elongated portion 32 extends sufficiently past the lower part 24 of the body portion 22 to accommodate for the thickness of the board and the desired spatial relationship between the board 12 and the bottom of the body portion 22 for the contact pins 60. The legs 30 may be rigid or flexible.

The elongated portion 32 of the legs 30 are also able to pivot with respect to the body portion 22 via the shoulder 31 of the legs 30. In the preferred embodiment, the pivoting action is necessary so that the legs 30 may pivot inwardly when extending through the securing holes 16 and then pivot back outwardly when the foot member 34 of the leg 30 extends past the bottom surface of the secondary device 12 thus pivoting at least partially back past the securing holes 16 to grasp the bottom surface of the secondary device 12. The foot member 34 may include a flat or tapered top surface, a flat or tapered bottom surface or many other configurations that are deemed suitable.

A foot member 34 extends from each elongated portion 32 of the legs 30. In alternate embodiments, multiple foot members 34 may be extend from each leg 30. The foot member 34 may extend outwardly, inwardly, or from either side, so long as the foot member 34 is used to grasp the bottom surface of the secondary device 12. The foot member 34 includes a flat upper surface 35 that to rest parallel and adjacent with the bottom surface and a tapered lower surface 36 to assist in guiding the legs 30 within the securing holes 16 when connecting the primary device 20 to the secondary device 12. The tapered surface may be angularly, rounded, or formed in various other manners.

It is appreciated that rather than the legs 30 being able to pivot the legs 30 may be able to switch between positions, such as through a toggle switch device. The legs 30 may further be comprised of cantilevers, which are flexed to one side, or they may flex around some center(s) using collapsible cores, which are expanded or contracted by actuating a central pin or pins. There may be other methods of achieving flex as well.

A pair of flanges 40 and preferably integrally formed with the body portion 22 also extend from the sides of the body portion 22 along an inside surface of the legs 30. The flanges 40 may be attached to the legs 30 or separately formed with the legs 30. Each side of the body portion 22 preferably includes a single flange 40 that spans across both side legs 30 as illustrated. The flange 40 serves to stabilize the legs 30 to prevent breakage. The flange 40 also serves to prevent the body portion 22 from moving to close to the secondary device 12 and thus damaging the contact pins 60.

The lower portion 62 of the flanges 40 extends to a vertical point along the legs 30 where the foot members 34 may grasp the bottom surface of the secondary device 12 and the contact pins 60 may properly engage the contact points 13 of the secondary device 12. The flanges 40 thus prevent the body portion 22 from moving downwards past a necessary point to prevent breakage of the pins. The distance that the flanges 40 extend downwards from the body portion 22 along the legs 30 thus forms the minimum distance and generally the utilized spatial relationship of the body portion 22 and the secondary device 12. It is appreciated that the flanges 40 are also able to pivot or move with the legs 30.

The primary device 20 also preferably includes a plurality of alignment pins 50 extending from the lower part 24 of the body portion 22 vertically downwards to align with and extend partially or wholly through the alignment holes 15 of the secondary device 12. The alignment pins 50 may be comprised of a conductive or non-conductive material. A primary use of the alignment pins 50 is to add further stability to the connection between the primary device 20 and the secondary device 12 to prevent breakage of the legs 30 or contact pins 60 of the primary device 20 from rotating, bumping into, or otherwise moving the primary device 20 when connected to the secondary device 12.

The alignment pins 50, in the preferred embodiment, are comprised of a strong structure and generally have a larger diameter than the contact pins 60. The alignment pins 50, contact pins 60, and legs 30 may be square, triangular, or any other regular or irregular shape, and may have a uniform or non uniform cross section. The alignment pins 50 are also generally longer than the contact pins 60 and extend past the flanges 40 so that the alignment pins 50 may extend sufficiently through or into the alignment holes 15. It is appreciated that the alignment pins 50 may extend completely through the alignment holes 15 to the other side of the secondary device 12, wherein clips (e.g. alligator clips), or other connecting elements may connect to the alignment pins 50 to provide an electrical connection. The upper portion 61 of the alignment pins 50 thus may be electrically connected together, to the contact pins 60, or various other electrical components or circuitry. The alignment pins 50 and the legs 30 may also be comprised of differing or similar diameters.

The primary device 20 also preferably includes a plurality of contact pins 60 extending from the lower part 24 of the body portion 22 vertically downwards to align with contact the contact points 13 of the secondary device 12. The contact pins 60 are generally comprised of a conductive material. The contact pins 60 thus provide the primary electrical connection for the primary device 20 with the secondary device 12 in the electrical circuit board embodiment of the present invention.

The contact pins 60 may extend solely from the lower part 24 of the body portion 22 or may extend all the way through the body portion 22 via a plurality of holes (not shown). In the latter case, the upper portion 61 of the contact pins 60 extending from the upper part 23 of the body portion 22 is electrically connected to the lower portion 62, wherein clips, soldering or crimping to an electrical cables, or other components may be connected to the upper portion 61 of the contact pins 60 to extend the electrical connection provided by the engagement of the contact pins 60 with the contact points 13. It is appreciated that the number of contact pins 60 may vary, such as but not limited to 2, 3, or 4 row designs with 10, 14, or 20 pins, as well as various other numbers of contact pins 60.

The lower portion 62 of the contact pins 60 is also able to vertically adjust via a spring 66. A spring 66 is interconnected between a catch portion 63 of the contact pin 60 and the lower part 24 of the body portion 22. The spring 66 may also be retained in place by a retainer 65 surrounding the spring 66. It is appreciated that the spring 66 may extend around the contact pin 60 or may be positioned at an end of the contact pin 60, wherein the catch portion 63 forms the top of the contact pin 60. It is appreciated that the springs 66 may be omitted, included in only a portion of the legs 30 or integral with the legs 30.

The lower portion 62 of the contact pin 60 is able to adjust vertically upwards when moving the primary device 20 closer to the secondary device 12 via extending the legs 30 through the securing holes 16. When the foot members 34 catch the bottom of the secondary device 12, the spring 66 exerts an outward force against the contact pin 60 towards the secondary device 12 thus forcing the contact pin 60 to remain engaged to the contact point 13 of the secondary device 12 and to maintain the spatial relationship between the body portion 22 and the secondary device 12 via effectively sandwiching the secondary device 12 between the contact pins 60 and the upper surface 35 of the foot members 34. The contact pins 60 may further be comprised of a telescoping structure. Telescoping spring-loaded contact pins 60, which compress their springs 66 when pressed against the top surface of the secondary device 12. It is also appreciated that other embodiments may use rigid, flexible or other styled contact pins 60. It is appreciated that the pins 60 may be inserted into plated holes within the contact points 13 to help align the pins 60. The tips of the pins 60 may be sharp, include crowns, or be textured to contact multiple contact points 13.

In the event that a contact pin 60 tip is damaged or for any other reason must be replaced, it can be pulled out and replaced without affecting the upper portion 61 of the contact pin 60 connected to the cable. Other embodiments may make use of one-piece contact pins 60 or contact pins 60 of more than two components. The preferred embodiment shows the contact pins 60 parallel to the legs 30. In other embodiments, the contact pins 60 may have other orientations with respect to the legs 30. The tips of the contact pins 60 that are to contact the circuit board also preferably define a plane. In other embodiments, the tips of the contact pins 60 may lie on more than one plane, may define a geometrical shape other than a plane, or may have any other spatial arrangement.

In alternate embodiments, circuitry, magnets, cables, may be assembled or affixed to each other by a variety of means including over molding, soldering, crimping, riveting, casting, extruding, stamping, putting in place or in addition to the contact pins 60. In other embodiments (for example a light pipe design) the entire primary device 20 may be a single formed or fabricated component, or features formed from separate components may be formed from one or more common components. In an over mold embodiment, the body portion 22 may be over molded onto the contact pins 60. The primary device 20 may also be over molded onto both the contact pins 60 and cable to form a single entity. Such an embodiment greatly increases the robustness of the primary device 20 as it protects the connections between the contact pins 60 and cable from damage.

Other embodiments may position primary devices 20 to communicate inductively, optically, via RF (radio frequency), or by other means with one or more secondary devices 12. Other embodiments may position primary devices 20 to illuminate, receive illumination, magnify, channel (e.g. light pipe) or reflect optical, electrical, or auditory energy, provide power to or from, or provide charge to or from secondary devices 12. Other embodiments may be used to inductively couple with one or more secondary devices 12 or position a sensor or transducer with respect to one or more secondary devices 12. Other embodiments may position primary devices 20 for structural, mechanical, aesthetic or other purposes with respect to secondary devices 12.

Figure 12:
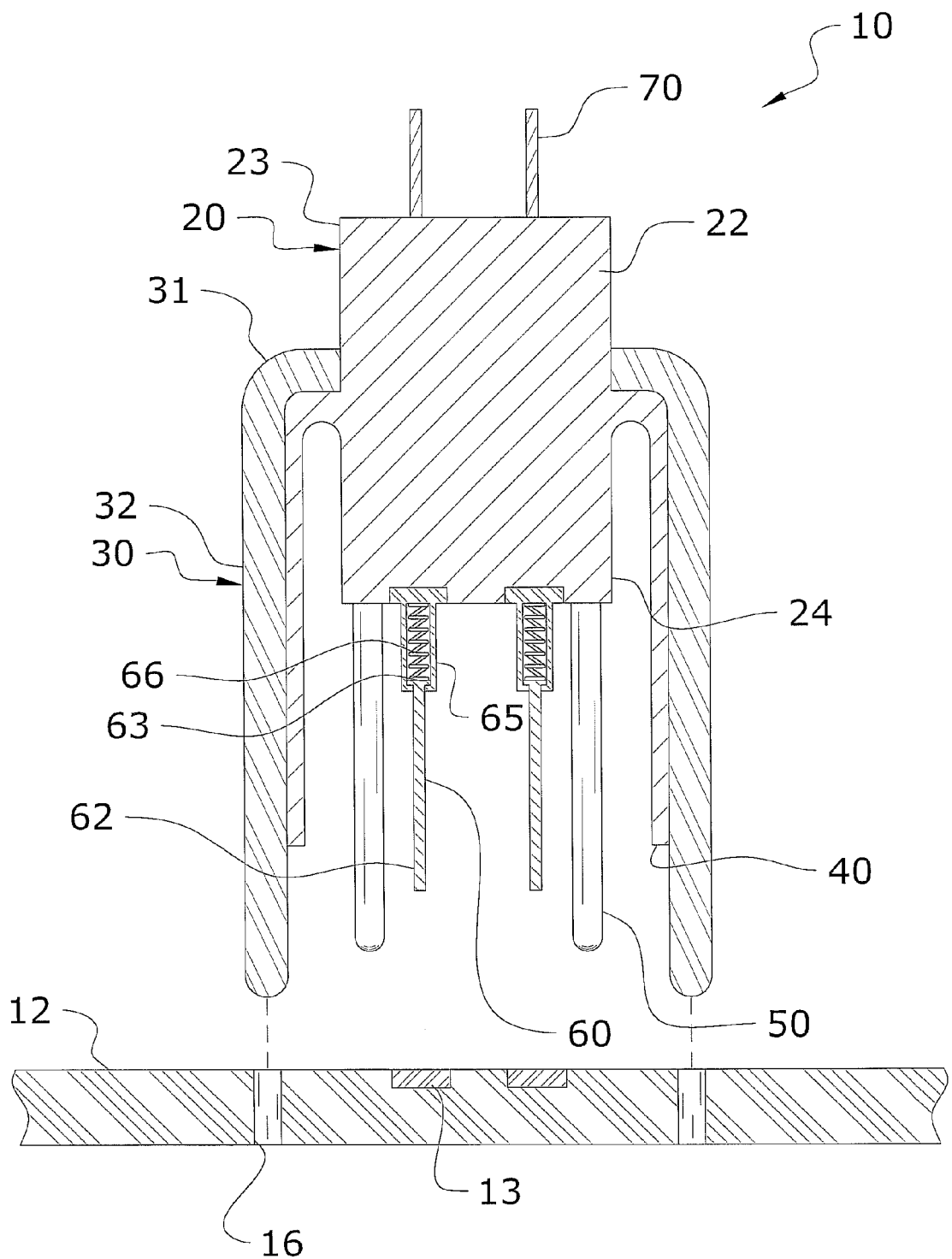
FIG. 12 is a side sectional view illustrating an alternate embodiment of the primary device exploded from and aligned with the secondary device.
Figure 13:
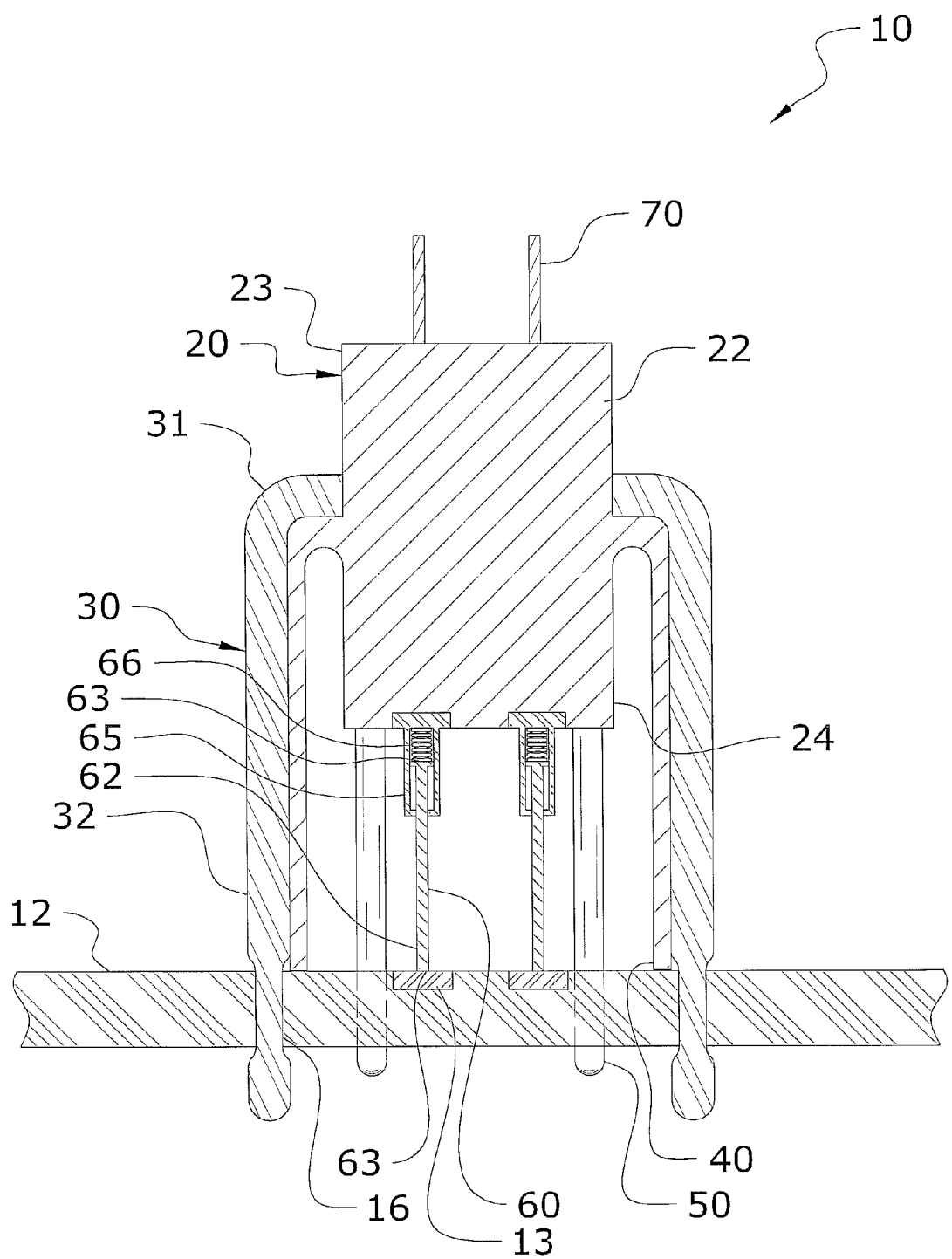
FIG. 13 is a side sectional view illustrating the alternate embodiment of FIG. 12 attached to the secondary device.

In another alternate embodiment, the legs 30 may also be comprised of a resilient or rubber like material that is secured within the holes 16 of the secondary device 12 as illustrated in FIGS. 12 and 13. The legs 30 are compressed when inserting within the holes 16 and then expand to prevent removal of the primary device 20 from the secondary device 12 when not desired. The contact pins 60 may or may not include springs 66 in this embodiment. The compressible leg 30 can also be a football or banana plug shape in further alternate embodiments. The legs 30 include a compressed position and an expanded position, wherein a first portion of the legs 30 positioned within the openings 16 is in said compressed position and a second portion of the legs 30 positioned outside the openings 16 is in the expanded position.

Figure 14:
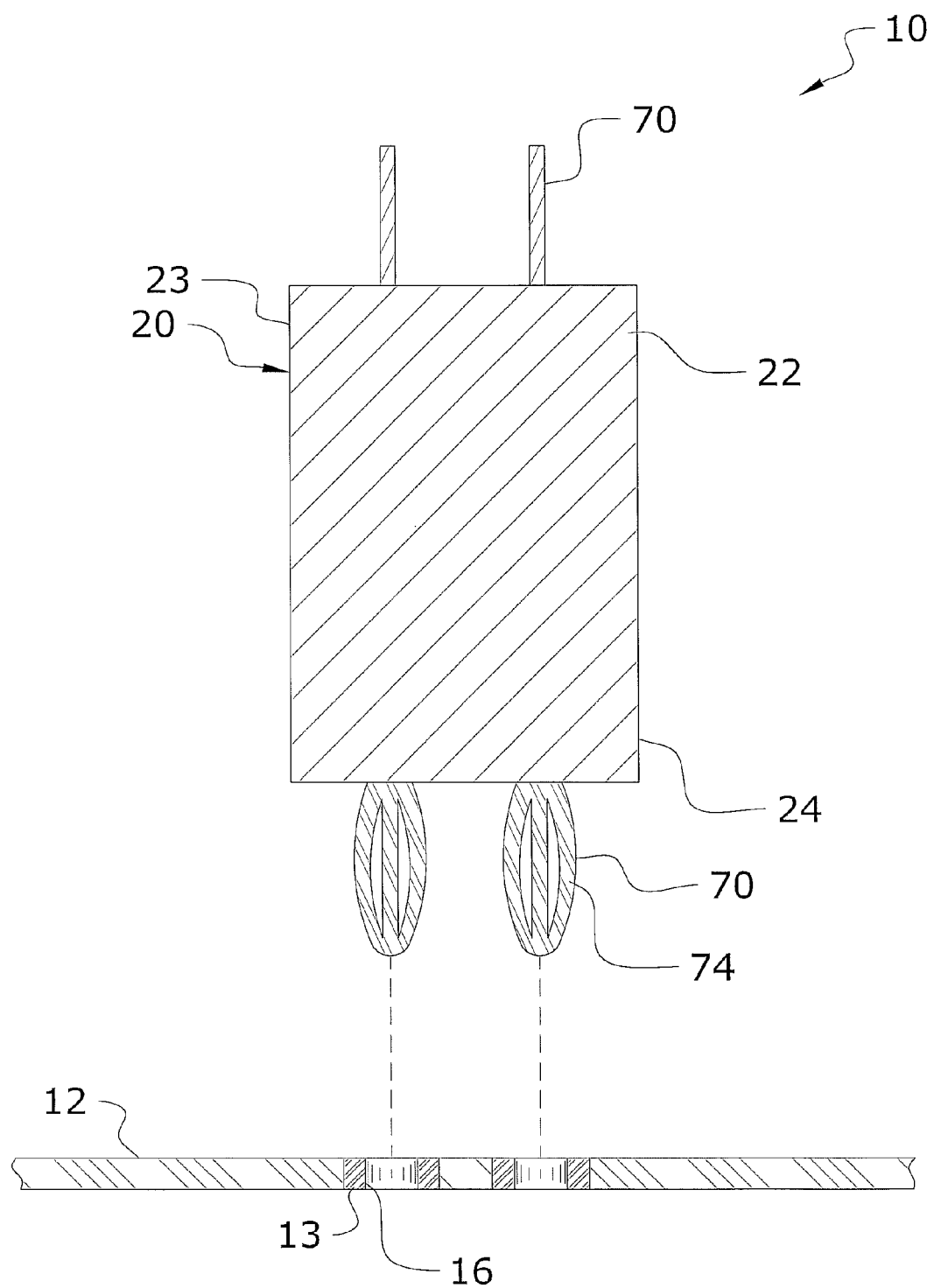
FIG. 14 is a side sectional view illustrating another alternate embodiment of the primary device exploded from and aligned with the secondary device.
Figure 15:
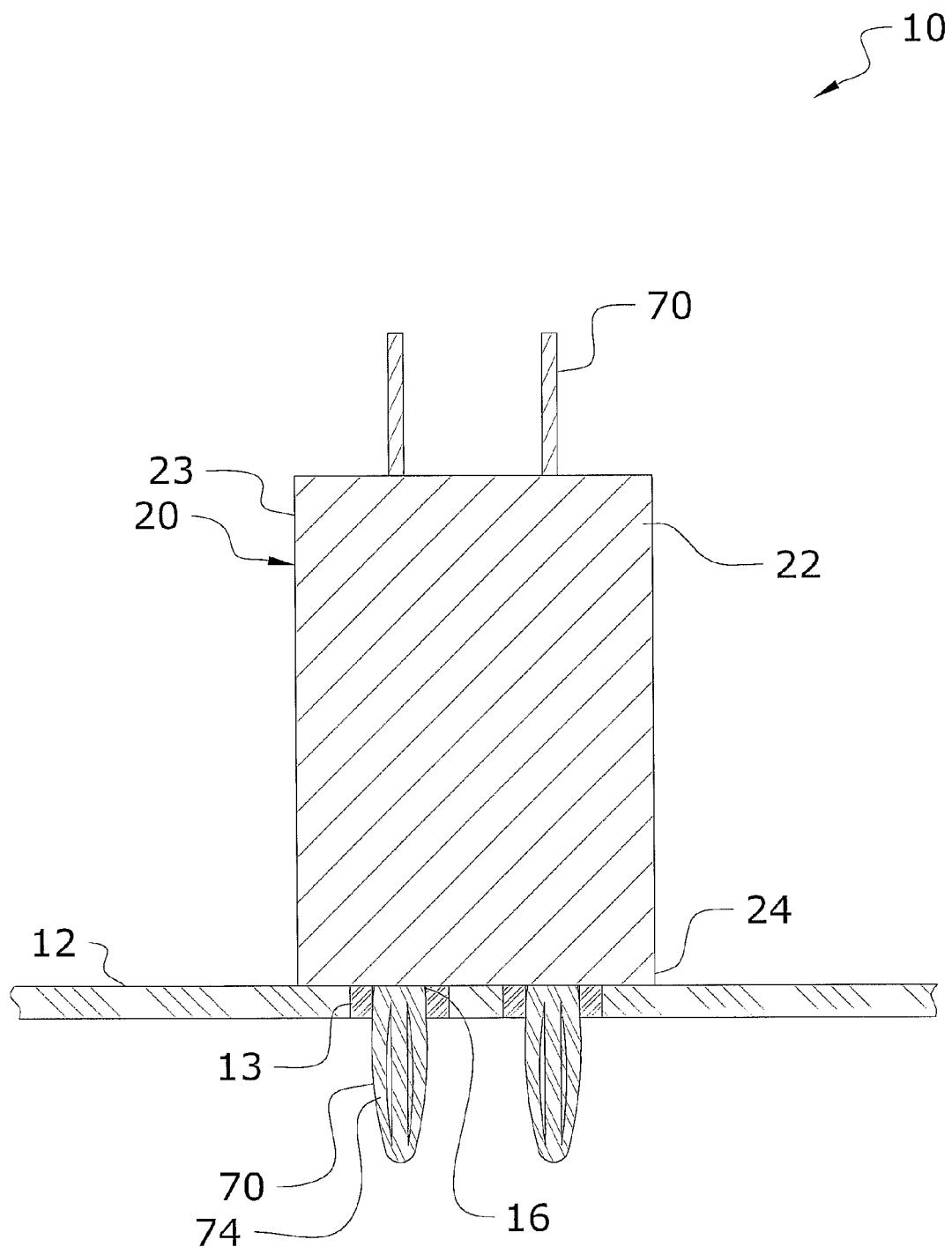
FIG. 15 is a side sectional view illustrating the alternate embodiment of FIG. 14 attached to the secondary device.

In addition, a contact pin 60 and an alignment pin 50 (and even a leg 30) may be combined into a single conductive member 70 serving more than one of these functions, such as a pin that is constructed like a banana plug pin. The embodiment may include a plurality of banana type plug pins. Outer strips of the conductive member 70, defining resilient members 74, collapse toward its center as it is pushed through the hole and then relax outward as it clears the hole. The resilient member 74 provides a biasing force upon the secondary device 12 to secure the primary device 20 to the secondary device 12 at said desired spatial relationship by expanding within the opening 16 to prevent the primary device 20 from being easily removed from the opening 16. The foot conductive member 70 engages the contact points 13 surrounding the openings 16. This would align, make electrical contact, and retain the part all at the same time thus achieving the functions of the alignment pin, contact pin, and leg respectively, all in one pin as illustrated in FIGS. 14 and 15.

Figure 16:
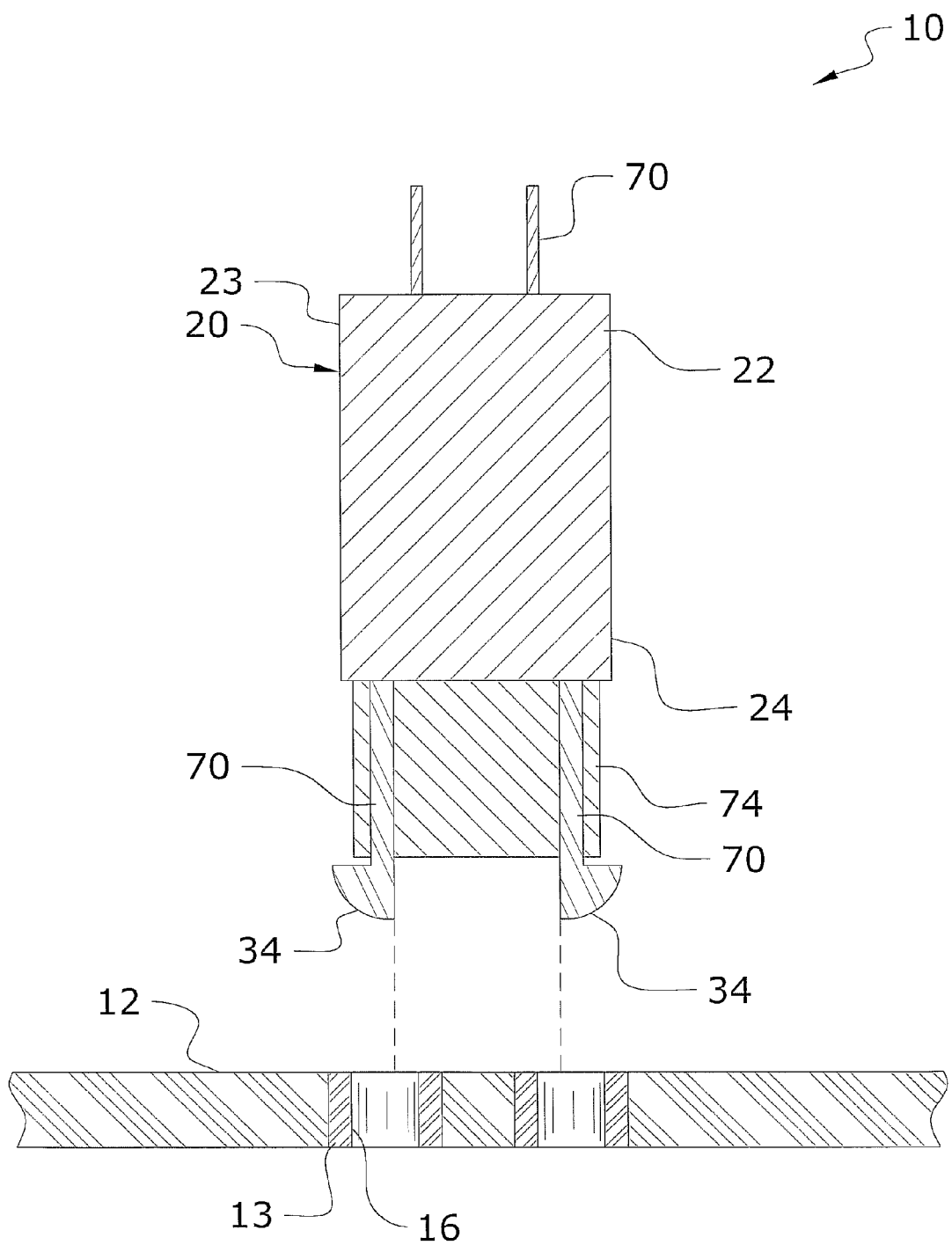
FIG. 16 is a side sectional view illustrating yet another alternate embodiment of the primary device exploded from and aligned with the secondary device.
Figure 17:
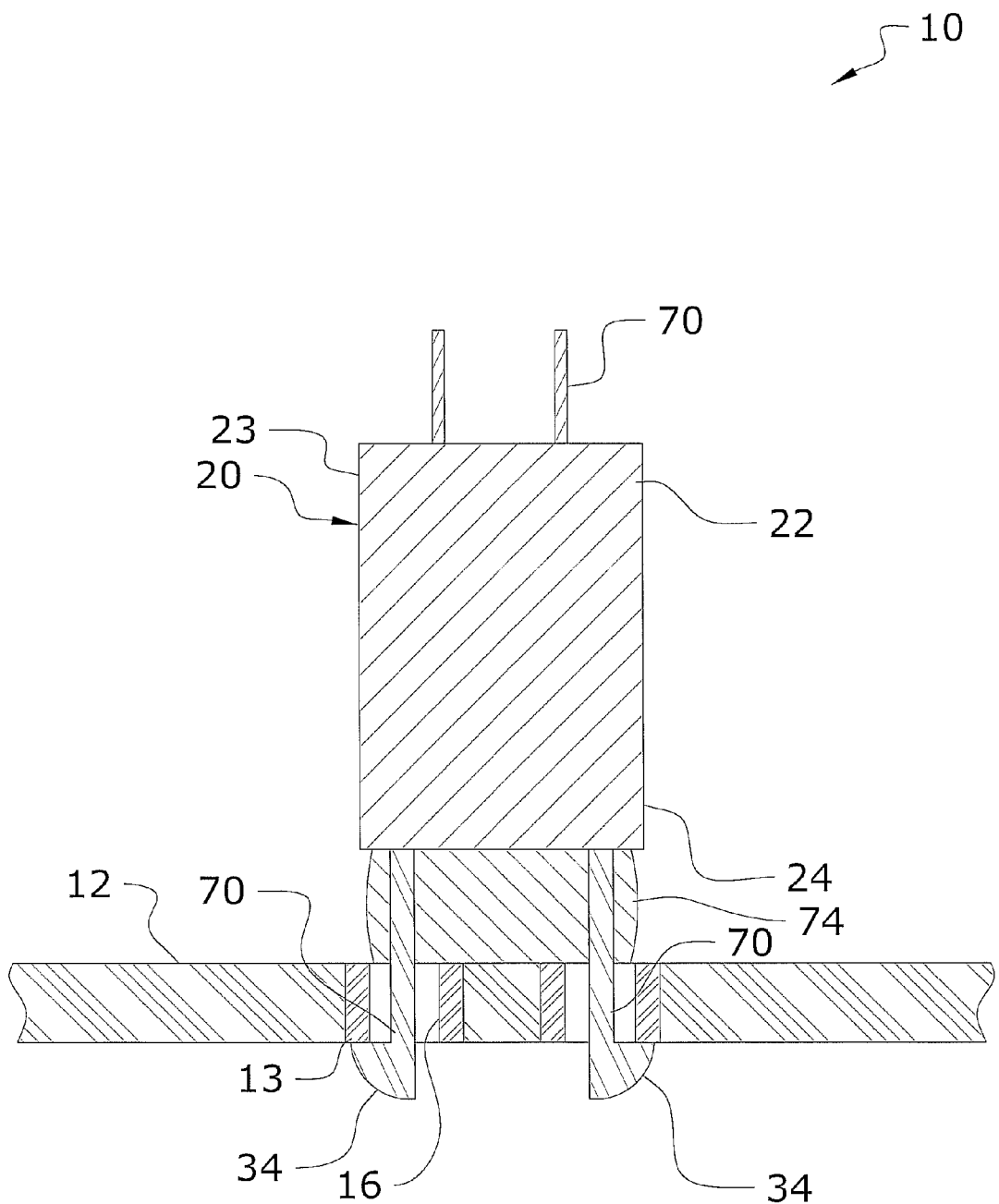
FIG. 17 is a side sectional view illustrating the alternate embodiment of FIG. 16 attached to the secondary device.

In yet another alternate embodiment as illustrated in FIGS. 16 and 17, a contact pin 60 and an alignment pin 50 (and even a leg 30) may be combined into a single conductive member 70. The conductive member 70 includes a foot member 34 integral with and conductive like the conductive member 70 to function similar as in the preferred embodiment in holding the underside of the secondary device 12. The embodiment also includes a resilient member 74 extending downward from the body portion 22 along the length of the combined component. The resilient member 74 which is connected to and between the conductive member 70 and the body portion 22 provides a spring like function to keep the foot members 34 tight against the underside of the secondary device 12 and thus primary device 20 secured to the secondary device 12 and is positioned between the body portion 22 and the secondary device 12. The resilient member 74 provides a biasing force upon the secondary device 12 to secure the primary device 20 to the secondary device 12 at said desired spatial relationship. The foot member 34 and/or conductive member 70 engage the contact points 13 surrounding the openings 16. The resilient members 74 of any of the embodiments may be rubbery, flexible metal, plastic, spring like or any material, shape or configuration to provide a bias force against the secondary device 12.

D. Operation of Preferred Embodiment

Figure 3:
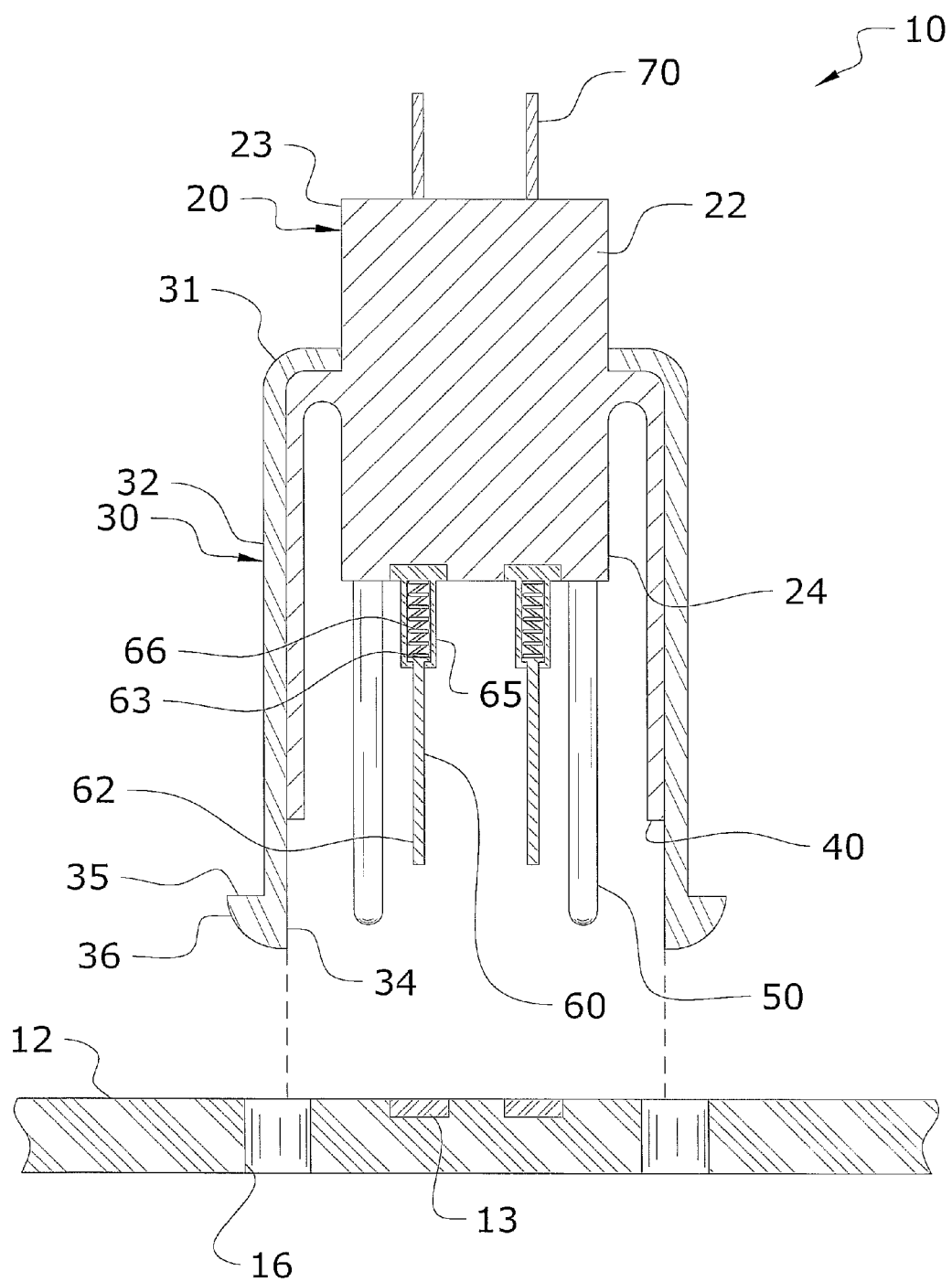
FIG. 3 is a side sectional view illustrating the primary device exploded from and aligned with the secondary device.
Figure 4:
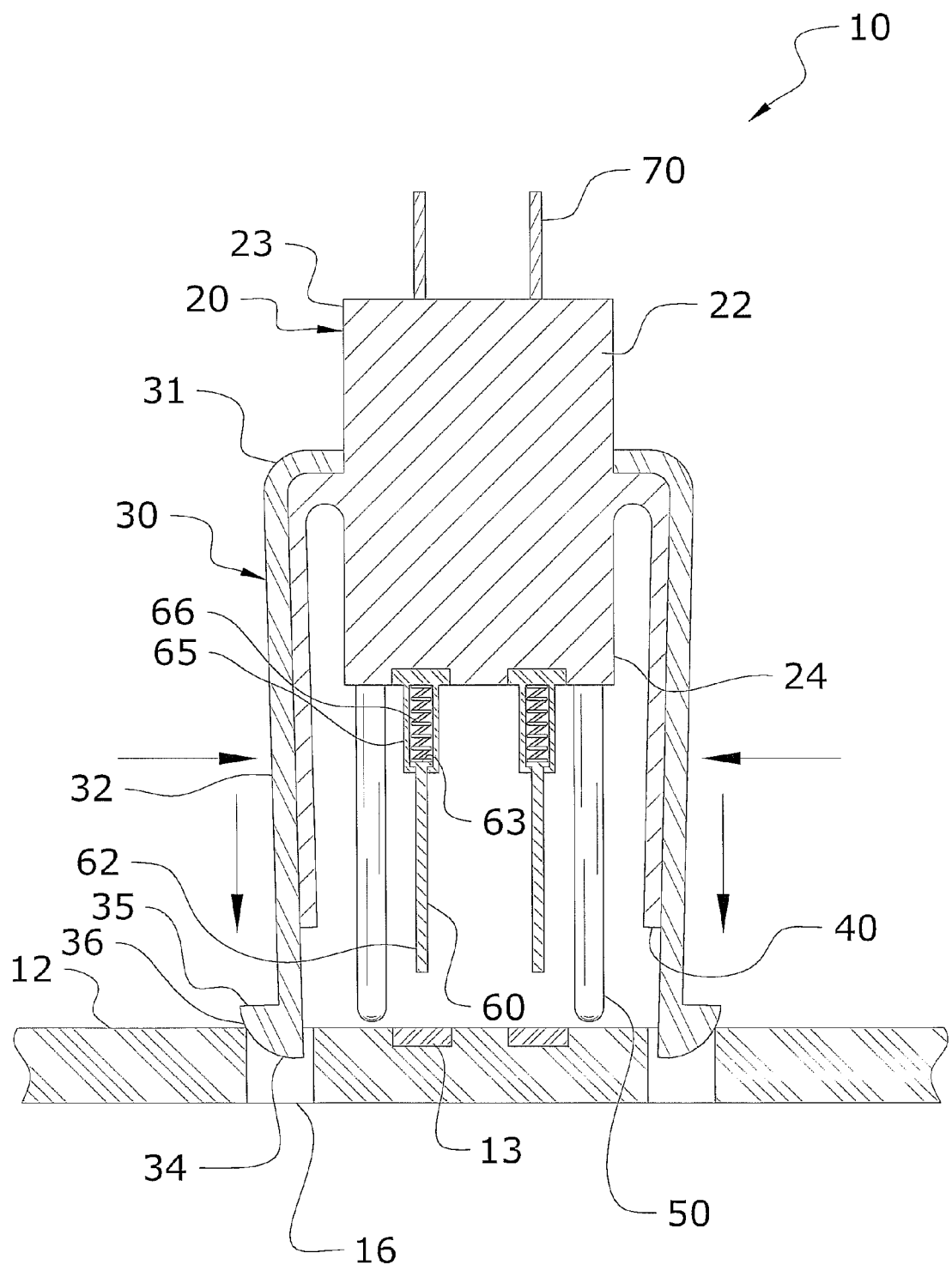
FIG. 4 is a side sectional view illustrating the primary device being initially inserted within the secondary device.

In use, the primary device 20 is first aligned with the contact points 13, alignment holes 15, and securing holes 16 of the secondary device 12 as illustrated in FIGS. 2 and 3. The legs 30 are then extended within the securing holes 16 of the secondary device 12. As the legs 30 extended within the securing holes 16, the tapered portion guides the legs 30 inwards, wherein the legs 30 pivot inwards to extend within the securing holes 16 as illustrated in FIG. 4.

Figure 5:
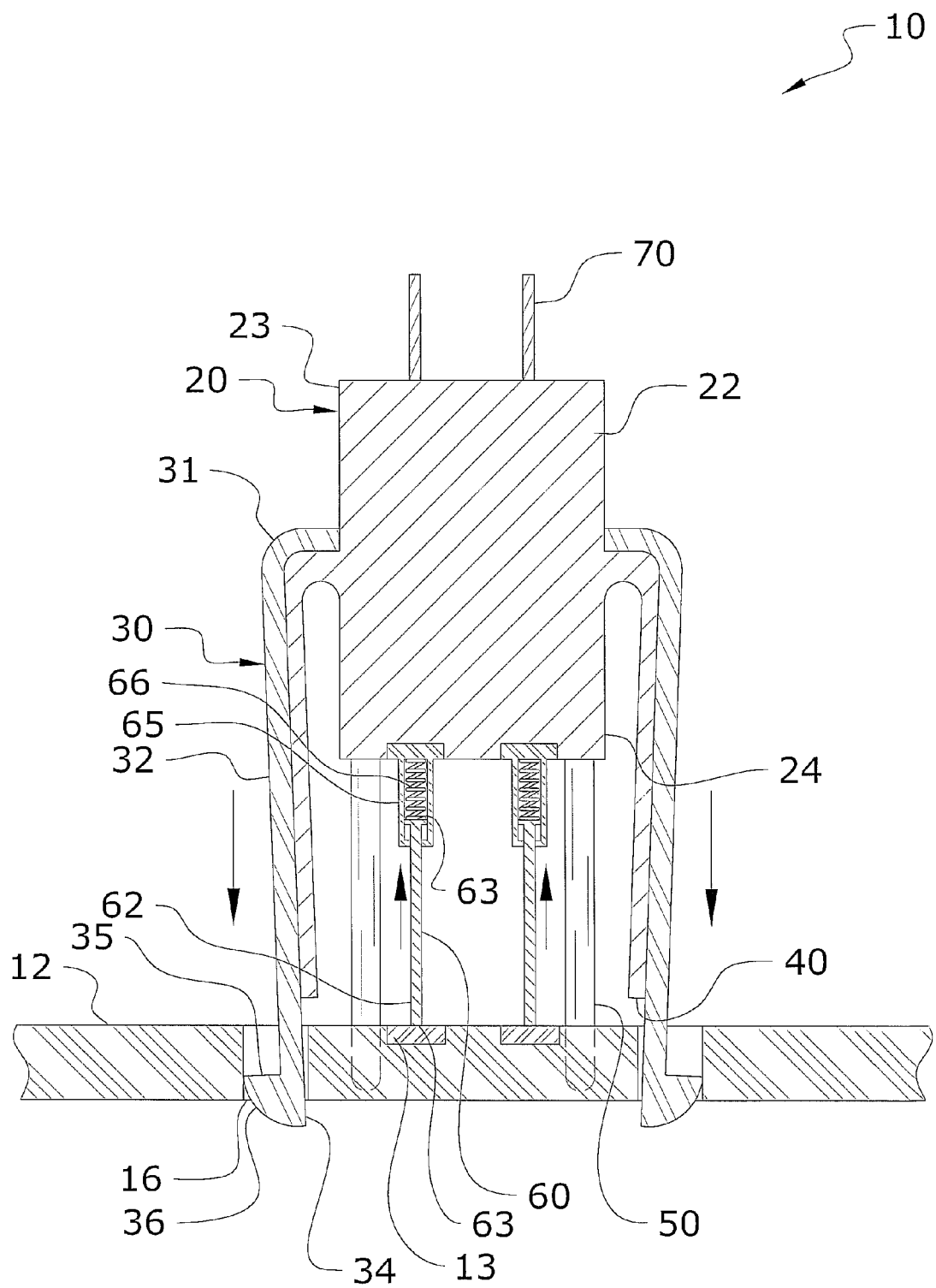
FIG. 5 is a side sectional view illustrating the primary device being further inserted within the secondary device.

The legs 30 are further extended through the securing holes 16, while the alignment pins 50 additionally enter the alignment holes 15, and the contact pins 60 engage the contact points 13 as illustrated in FIG. 5. As the contact pins 60 engage the contact points 13, the contact pins 60 are pushed upwards or away from the contact points 13 causing the spring 66 to compress as illustrated in FIG. 5.

Figure 6:
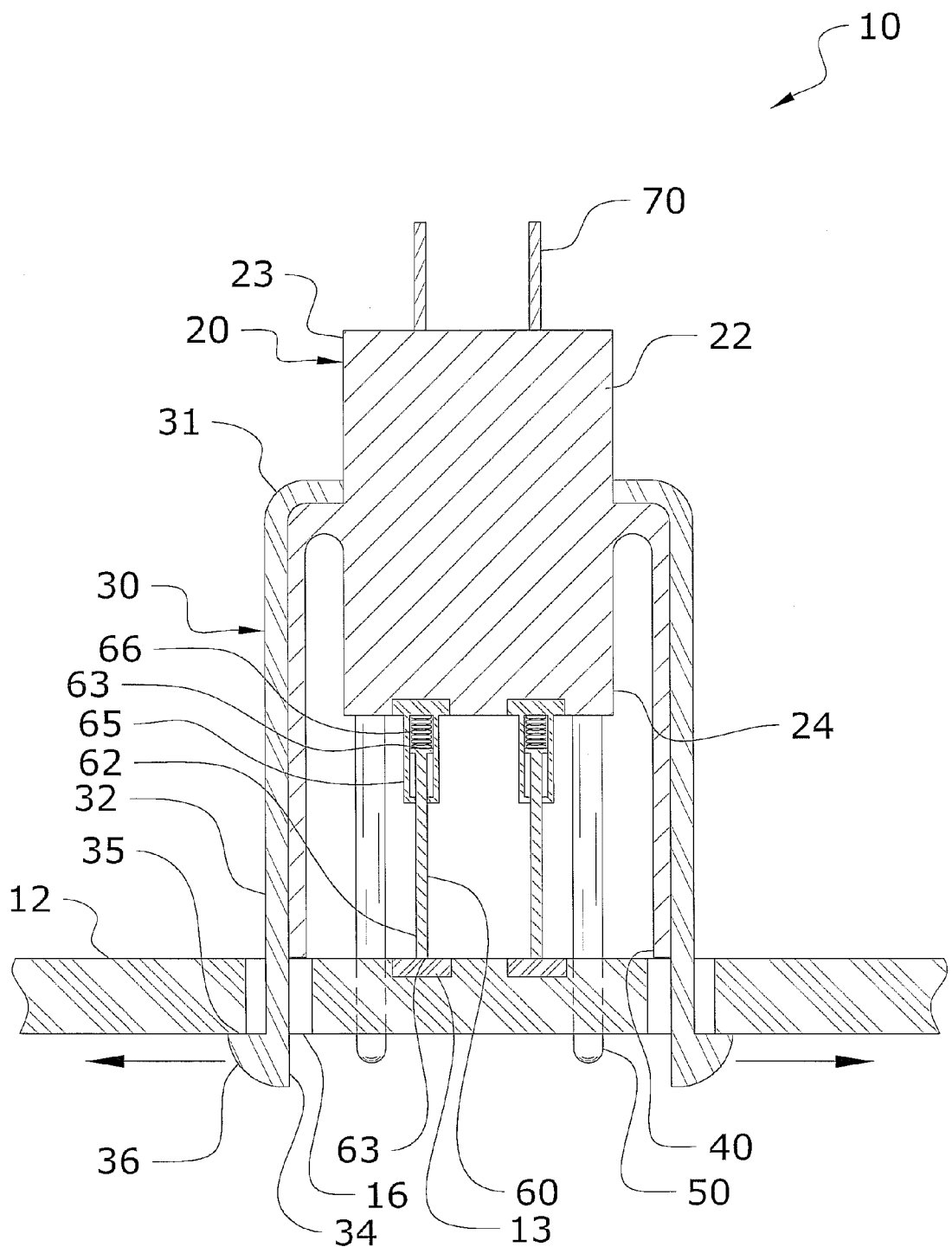
FIG. 6 is a side sectional view illustrating the primary device attached to the secondary device.

When the upper surface 35 of the foot members 34 of the legs 30 clears the bottom surface of the secondary device 12, the "springiness" of the legs 30 automatically cause the legs 30 to pivot back outwards toward an initial position thus allowing the upper surface 35 of the foot members 34 to grasp the bottom surface of the secondary device 12 as illustrated in FIG. 6.

The alignment pins 50 may also extend beyond the bottom surface of the secondary device 12 at this time. In addition, the spring 66 exerts an outward force upon the contact pins 60 so that the contact pins 60 and the spring 66 maintain a spatial relationship between the primary device 20 and the secondary device 12. It is appreciated that the force of the spring 66 effectively sandwiches the secondary device 12 between the lower portion 62 of the contact pins 60 and the upper surface 35 of the foot members 34.

Figure 7:
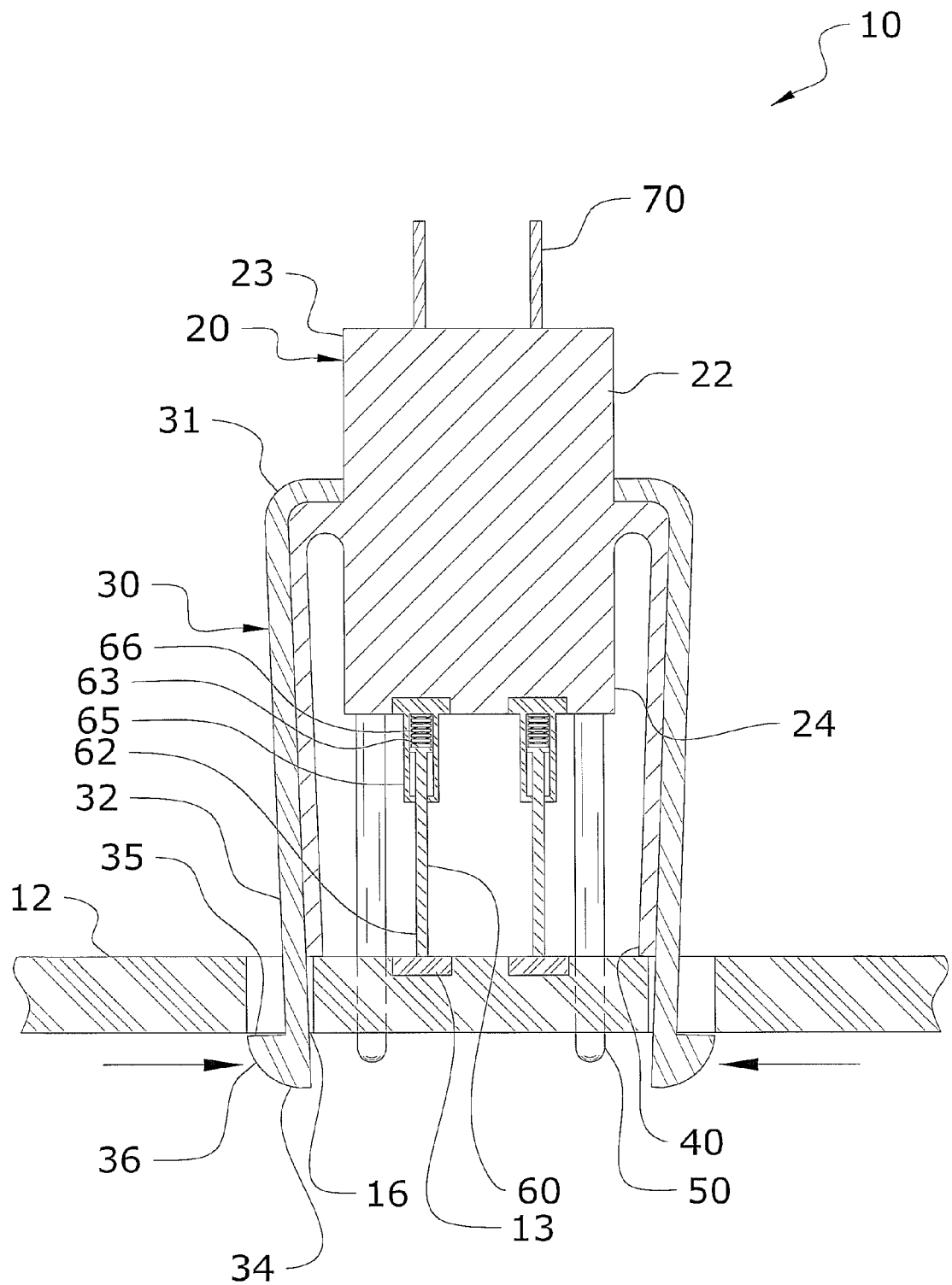
FIG. 7 is a side sectional view illustrating the primary device being adjusted to be removed from the secondary device.
Figure 8:
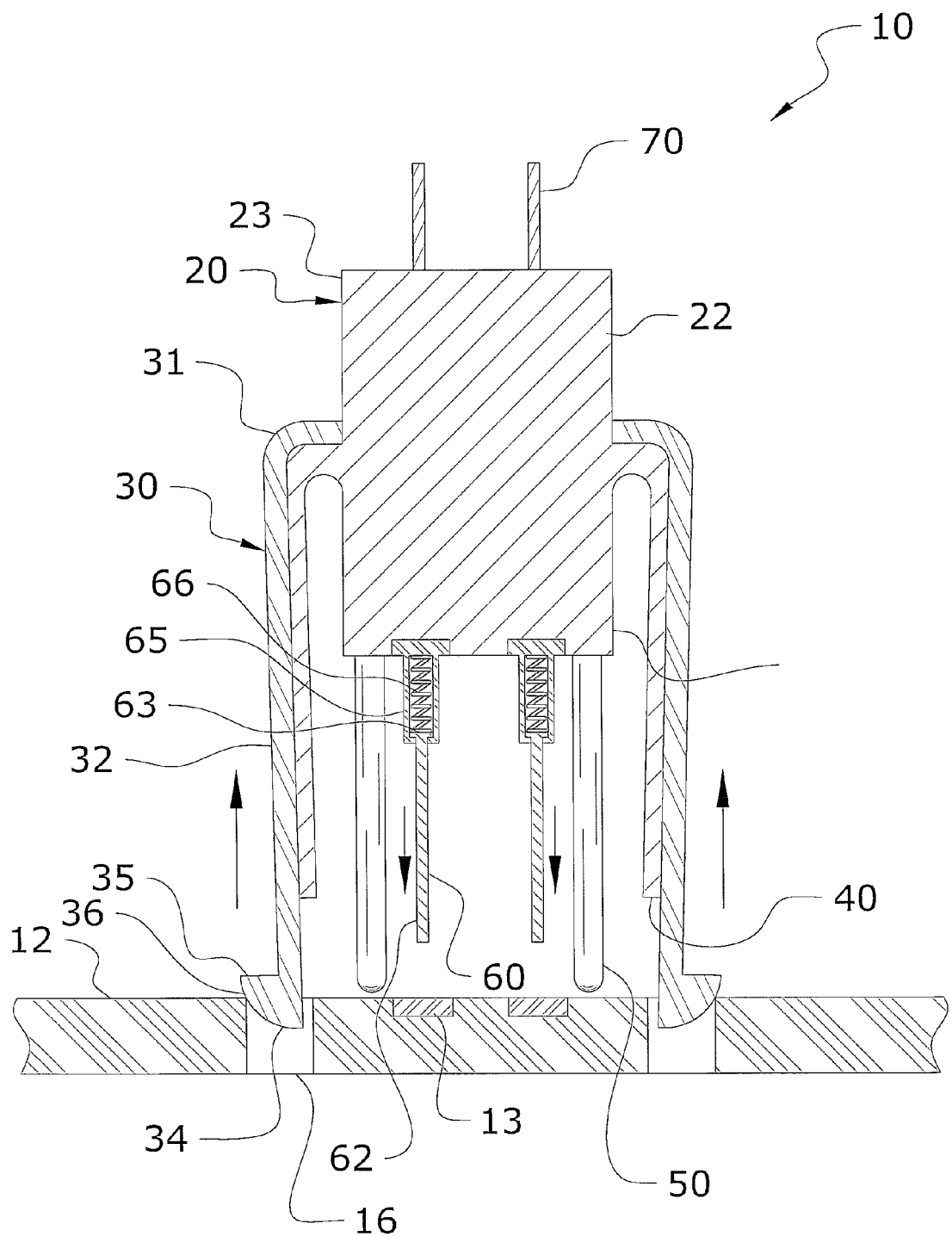
FIG. 8 is a side sectional view illustrating the primary device being removed from the secondary device.
Figure 9:
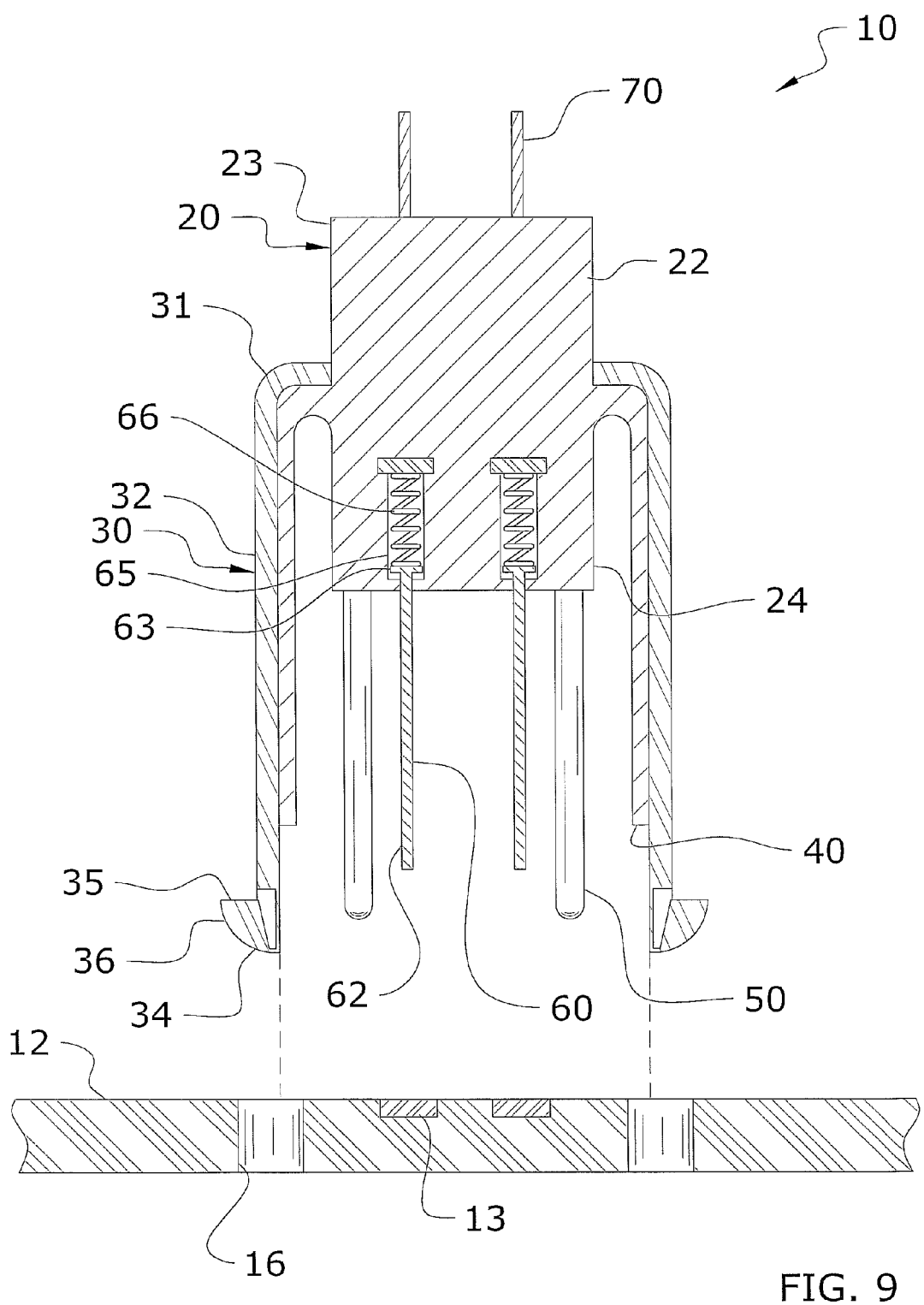
FIG. 9 is a side sectional view illustrating the primary device removed from the secondary device.
Figure 10:
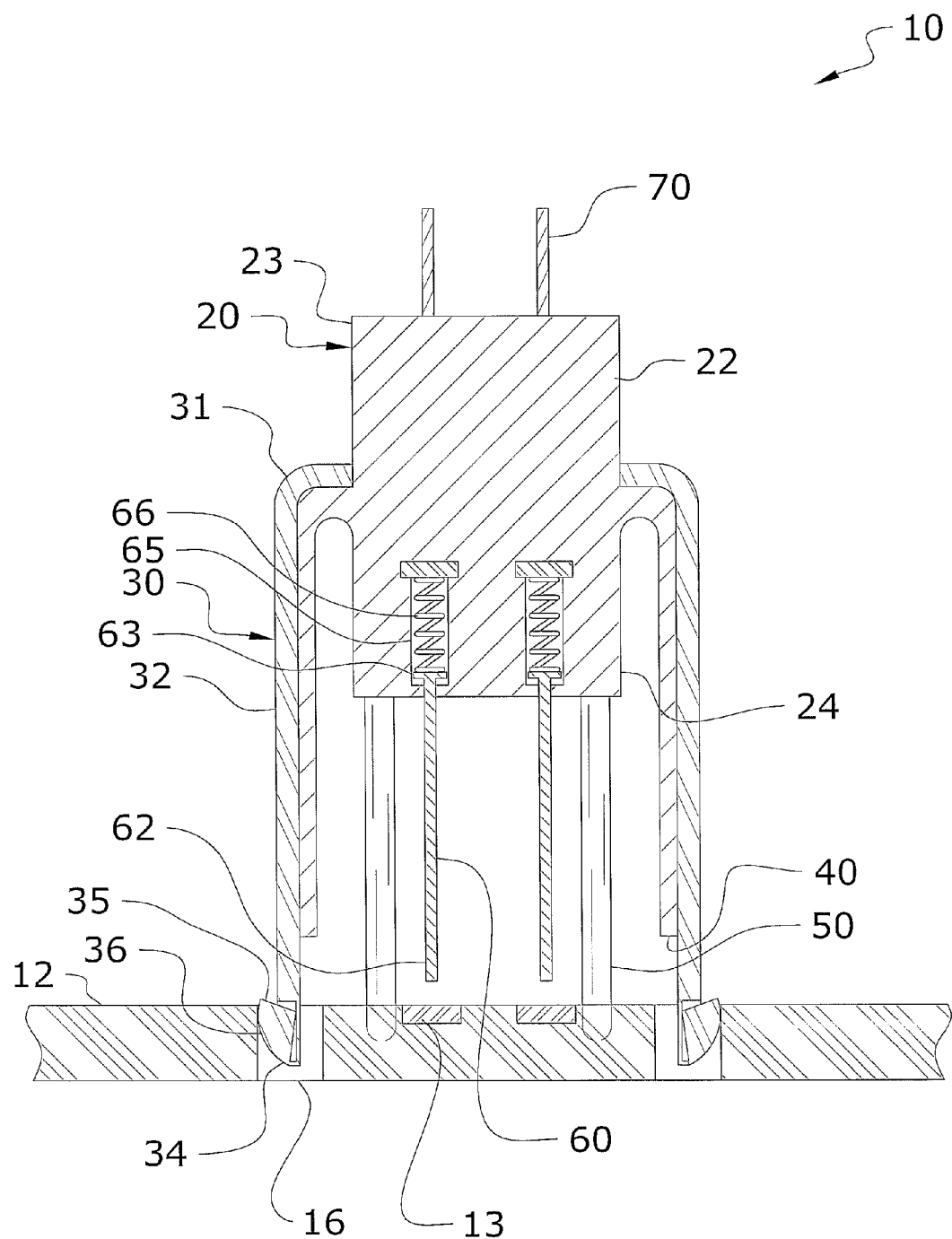
FIG. 10 is a side sectional view illustrating the primary device being initially inserted within the secondary device, wherein the primary device includes alternate types of adjustable foot members.
Figure 11:
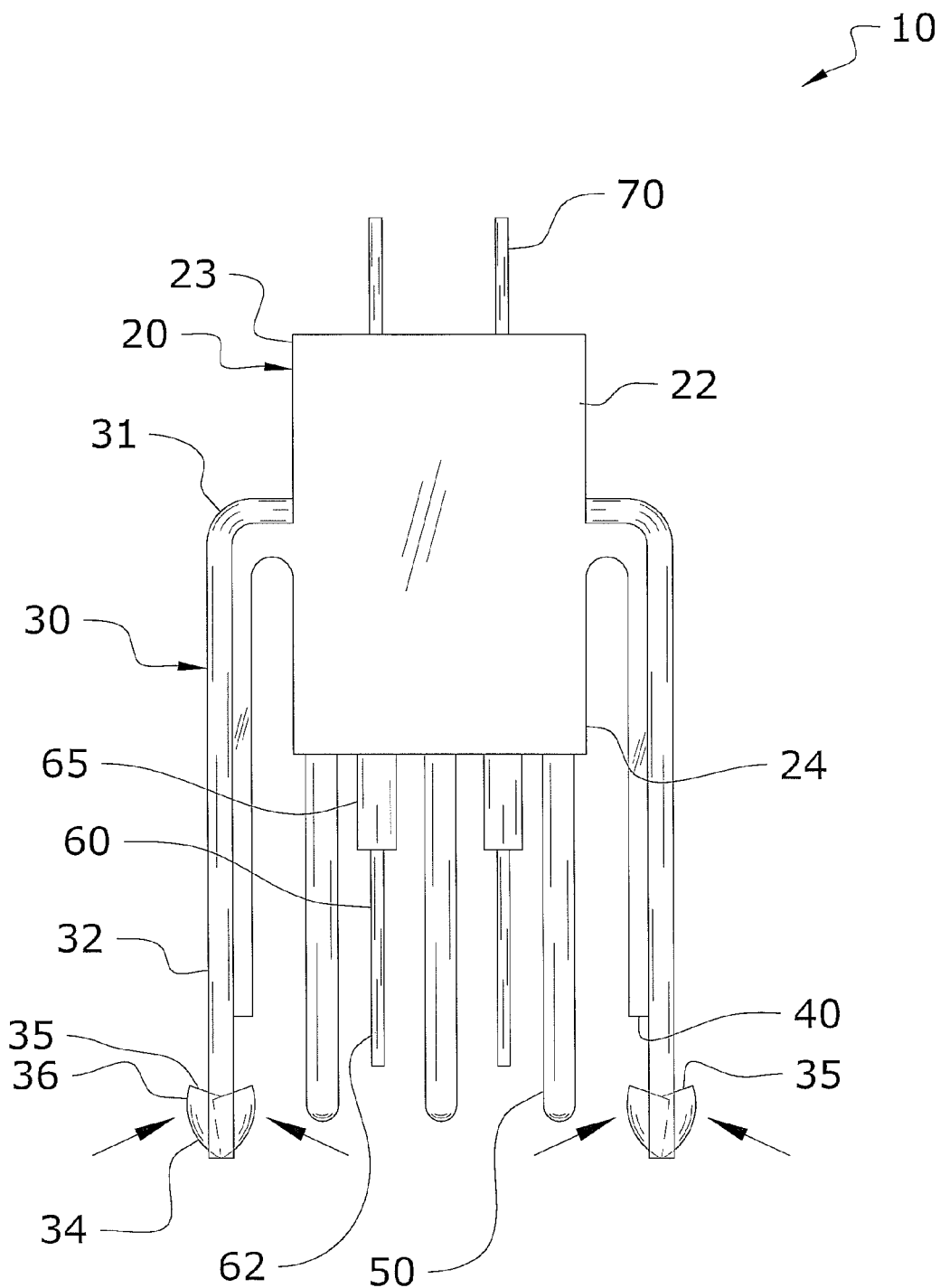
FIG. 11 is a side view illustrating adjustable foot members upon the primary device.

When removing the primary device 20 from the secondary device 12, the elongated portion 32 of the legs 30 or the foot members 34 are depressed inwards so that the foot member 34 is completely aligned with the securing holes 16 as illustrated in FIG. 7. The primary device 20 may then be simply pulled away from the secondary device 12 in a reverse manner of attachment as illustrated in FIGS. 8 and 9. Once the foot members 34 clear the securing holes 16, the legs 30 automatically pivot back to an initial position as illustrated in FIG. 9.

It is appreciated that the primary device 20 may be connected to cables, wires, or other transmission devices, wherein the primary device directly connects to the secondary device 12 without the use of any mating connectors, wherein the legs 30 function to secure the primary device 20 to the secondary device 12 and the contact pins 60 provide the electrical or other connection. The legs 30 and contact pins 60 may be combined or integral in various embodiments of the present invention.

Unless otherwise defined, all technical and scientific terms used herein have the same meaning as commonly understood by one of ordinary skill in the art to which this invention belongs. Although methods and materials similar to or equivalent to those described herein can be used in the practice or testing of the present invention, suitable methods and materials are described above. All publications, patent applications, patents, and other references mentioned herein are incorporated by reference in their entirety to the extent allowed by applicable law and regulations. In case of conflict, the present specification, including definitions, will control. The present invention may be embodied in other specific forms without departing from the spirit or essential attributes thereof, and it is therefore desired that the present embodiment be considered in all respects as illustrative and not restrictive. Any headings utilized within the description are for convenience only and have no legal or limiting effect.

The invention claimed is:

1. A connector for mating a contact pin with a secondary device without the use of a mating connector, said connector separately formed from said secondary device and adapted to removably connect to said secondary device, said connector comprising:
    a body portion;
    a plurality of legs extending from said body portion, said plurality of legs integrally formed with said body portion to comprise a one-piece unitary structure, and said plurality of legs pivotal with respect to said body portion, each of said plurality of legs having a foot member laterally extending from a lower end of each of said plurality of legs;
    at least one contact pin extending from said body portion for engagement with said secondary device, said at least one contact pin maintains a separation between a lower end of said body portion and said secondary device; and
    at least one spring in contact with said at least one contact pin for providing a bias force against said secondary device with a lower end of said at least one contact pin.

2. The connector of claim 1, including a coating surrounding an outer surface of said connector to provide electromagnetic interference shielding.

3. The connector of claim 1, wherein said plurality of legs are parallel to said at least one contact pin.

4. The connector of claim 1, wherein said plurality of legs and said at least one contact pin are comprised of differing diameters.

5. The connector of claim 1, wherein said at least one contact pin is comprised of a plurality of contact pins.

6. The connector of claim 1, wherein said foot member includes a flat upper surface.

7. The connector of claim 1, including at least one flange adjacent to and parallel with said plurality of legs.

8. The connector of claim 1, including at least one alignment pin insertable within at least one alignment hole of said secondary device.

9. The connector of claim 8, wherein said at least one alignment pin includes a plurality of alignment pins to surround said at least one contact pin.

10. The connector of claim 8, wherein said at least one alignment pin is comprised of a differing diameter than said at least one contact pin.

11. The connector of claim 1, wherein said at least one contact pin extends from beyond a lower part of said body portion to beyond an upper part of said body portion.

12. The connector of claim 1, wherein said secondary device is comprised of a printed circuit board.

13. A connector for mating a contact pin with a printed circuit board, said connector separately formed from said printed circuit board and adapted to removably connect to said printed circuit board, said connector comprising:
    a body portion;
    a plurality of legs extending from said body portion, said plurality of legs integrally formed with said body portion to comprise a one-piece unitary structure, and said plurality of legs pivotal with respect to said body portion, each of said plurality of legs having a foot member laterally extending from a lower end of each of said plurality of legs;
    a plurality of alignment pins extending from said body portion;
    a plurality of contact pins extending from said body portion for engagement with said printed circuit board, said plurality of contact pins maintain a separation between a lower end of said body portion and said printed circuit board, said plurality of contact pins each being electrically conductive;
    a plurality of springs each in contact with an upper end of one of said plurality of contact pins and a lower end of said body portion for providing a bias force against said printed circuit board with a lower end of a respective one of said plurality of contact pins; and
    at least one conductive member extending from an upper end of said body portion, said at least one conductive member in electrical contact with at least one of said plurality of contact pins.

14. The connector of claim 13, wherein said plurality of legs each extend below said body portion a first distance, wherein said plurality of alignment pins each extend below said body portion a second distance, and wherein said plurality of contact pins each extend below said body portion a third distance, wherein said first distance is greater than said second distance, and wherein said second distance is greater than said third distance so that said lower end of said plurality of legs extends below a lower end of said plurality of alignment pins, and said lower end of said plurality of alignment pins extends below said lower end of said plurality of contact pins.

15. The connector of claim 13, wherein each said foot member includes a flat upper surface.

16. The connecting system of claim 13, including a flange extending from said body portion and between a pair of said plurality of legs, said flange being integral with said body portion and said pair of legs to comprise a one-piece unitary structure, wherein said flange extends below said body portion a distance equal to said plurality of contact pins when said plurality of springs are in a compressed position.

17. A connecting system for maintaining electrical contact with a contact point of a circuit board, comprising:

a circuit board having a plurality of securing holes, a plurality of alignment holes, and at least one contact point, said plurality of securing holes extend through said circuit board, said plurality of alignment holes extend through said circuit board; and a connector for detachably connecting to said circuit board;

said connector having a body portion and a plurality of legs extending from said body portion, said plurality of legs integrally formed with said body portion to comprise a one-piece unitary structure, and said plurality of legs pivotal with respect to said body portion, each of said plurality of legs having a foot member laterally extending from a lower end of each of said plurality of legs, wherein said lower end of each of said plurality of legs aligns with and extends through a respective one of said plurality of securing holes, said foot member having a flat upper surface for engagement with a bottom surface of said circuit board, said bottom surface being opposite a top surface having said at least one contact point;

said connector including a plurality of alignment pins extending from said body portion, wherein a lower end of each of said plurality of alignment pins aligns with and extends within a respective one of said plurality of alignment holes;

said connector including at least one contact pin extending from said body portion for engagement with said at least one contact point of said printed circuit board, said at least one contact pin maintains a separation between a lower end of said body portion and said top surface of said printed circuit board, said at least one contact pin being electrically conductive; and said connector including at least one spring in contact with an upper end of said at least one contact pin and a lower end of said body portion for providing a bias force against said at least one contact point of said printed circuit board with a lower end of said at least one contact pin, said at least one spring retained in a vertical arrangement via a retainer surrounding said at least one spring and extending from said lower end of said body portion; and said connector including at least one conductive member extending from an upper end of said body portion, said at least one conductive member in electrical contact with said at least one contact pin.

18. The connecting system of claim 17, wherein said plurality of legs each extend below said body portion a first distance, wherein said plurality of alignment pins each extend below said body portion a second distance, and wherein said at least one contact pin extends below said body portion a third distance, wherein said first distance is greater than said second distance, and wherein said second distance is greater than said third distance so that said lower end of said plurality of legs extends below said lower end of said plurality of alignment pins, and said lower end of said plurality of alignment pins extends below said lower end of said at least one contact pin.

19. The connecting system of claim 17, wherein said connector includes a flange extending from said body portion and between a pair of said plurality of legs, said flange integral with said body portion and said pair of legs to comprise a one-piece unitary structure.

20. The connecting system of claim 19, wherein said flange extends below said body portion a distance equal to said at least one contact pin when said at least one spring is in a compressed position, said at least one spring in said compressed position when said at least one contact pin is in contact with said at least one contact point and said plurality of legs are extended through said plurality of securing holes so that said flat upper surface of each said foot member engages said bottom surface of said circuit board.

* * * * *